(12) United States Patent
Kwa et al.

(10) Patent No.: US 7,265,632 B2
(45) Date of Patent: Sep. 4, 2007

(54) AMPLIFIER CIRCUIT, AND SYSTEM INCORPORATING SAME

(75) Inventors: Hock Tiong Kwa, Singapore (SG); Xue Min Ji, Singapore (SG); Bin Zhang, Singapore (SG); Pak Kwong Chan, Singapore (SG)

(73) Assignee: Avago Technologies ECBU IP (Singapore) Pte. Ltd., Singapore (SG)

(*) Notice: Subject to any disclaimer, the term of this patent is extended or adjusted under 35 U.S.C. 154(b) by 132 days.

(21) Appl. No.: 11/282,455

(22) Filed: Nov. 17, 2005

(65) Prior Publication Data

US 2007/0109056 A1    May 17, 2007

(51) Int. Cl.
*H03F 3/08* (2006.01)
(52) U.S. Cl. ...................... 330/308; 330/100
(58) Field of Classification Search .......... 330/98, 330/99, 100, 308; 250/214 A
See application file for complete search history.

(56) References Cited

U.S. PATENT DOCUMENTS

| 4,458,212 A | 7/1984 | Brehmer et al. |
| 6,762,644 B1 | 7/2004 | Sutardja |
| 6,784,749 B1 * | 8/2004 | Cove ........................... 330/308 |
| 6,809,594 B2 | 10/2004 | Sutardja |
| 6,836,182 B1 | 12/2004 | Sutardja |
| 2004/0056722 A1 | 3/2004 | Sutardja |

OTHER PUBLICATIONS

Wu et al.; "A Novel CMOS Transimpedance Amplifier for DVD Application"; ECCTD'03-European Conference on Circuit Theory and Design; Sep. 1-4, 2003; Cracow, Poland; pp. II-233-II-236.

* cited by examiner

*Primary Examiner*—Steven J. Mottola

(57) ABSTRACT

In one embodiment, a current source circuit having a reference resistor produces first, second and third bias currents that vary with manufacturing variances of the current compensation resistor. An input amplification stage includes a transconductance stage biased by the first bias current, a first transimpedance amplifier (TIA) biased by the second bias current, and a first feedback resistor coupled between the first TIA's input and output. The input of the first TIA is coupled to an output of the transconductance stage. An output amplification stage is biased by the third bias current and has an input coupled to an output of the first TIA. A second feedback resistor is coupled between the output of the output amplification stage and the input of the transconductance stage. The reference resistor and first and second feedback resistors are formed using a common manufacturing process.

7 Claims, 3 Drawing Sheets

AMPLIFIER CIRCUIT, AND SYSTEM INCORPORATING SAME

BACKGROUND

Many integrated circuit (IC) designs face limitations on bandwidth and consume more power than is desirable—especially given industry trends of moving to higher bandwidth and lower power designs. Transimpedance amplifiers (TIAs), which form the front-end of nearly all optocoupler ICs, can consume a large percentage of an IC's supply current. As a result, improvements in the bandwidth and power consumption of an IC's TIA are always desirable.

SUMMARY OF THE INVENTION

In one embodiment, an amplifier circuit comprises a current source circuit having a reference resistor. The current source circuit produces first, second and third bias currents that vary with manufacturing variances of the reference resistor. The amplifier circuit further comprises an input amplification stage and an output amplification stage. The input amplification stage comprises 1) a transconductance stage that is biased by the first bias current, and 2) a first transimpedance amplifier (TIA) that is biased by the second bias current. The output amplification stage is biased by the third bias current. The first TIA has a first feedback resistor that is coupled between the first TIA's input and output. The input of the first TIA is coupled to an output of the transconductance stage, and the output of the first TIA is coupled to an input of the output amplification stage. A second feedback resistor is coupled between the output of the output amplification stage and the input of the transconductance stage to form a second TIA. The reference resistor, the first feedback resistor and the second feedback resistor are all formed using a common manufacturing process.

Other embodiments are also disclosed.

BRIEF DESCRIPTION OF THE DRAWINGS

Illustrative embodiments of the invention are illustrated in the drawings, in which.

DETAILED DESCRIPTION

A TIA is defined herein as an inverting voltage gain amplifier with a feedback resistor ($R_f$) tied between the amplifier's signal input and signal output. By means of its feedback resistor ($R_f$), the TIA translates an input current (i) to an output voltage ($V_O$).

Figure 1:
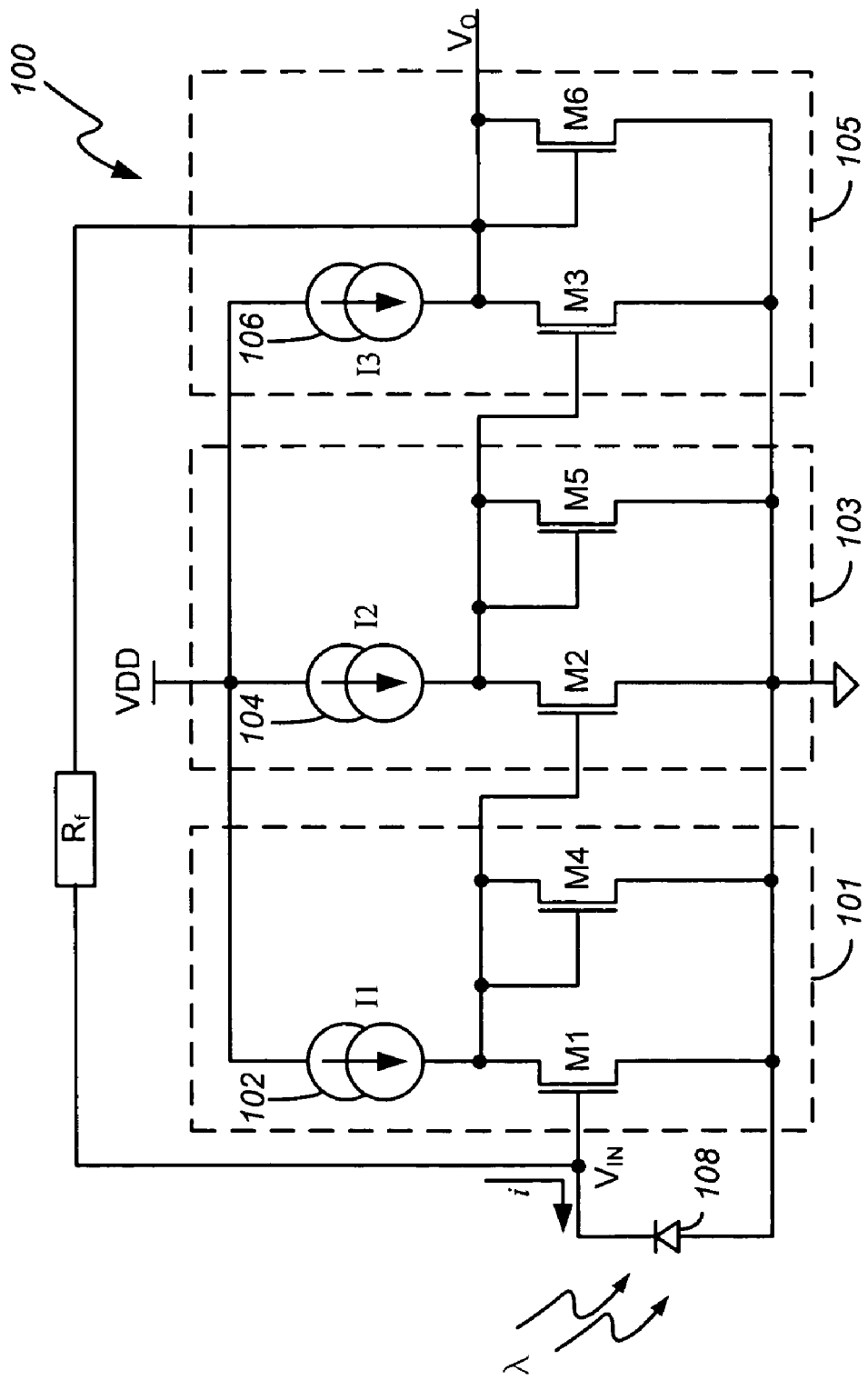
FIG. 1 illustrates an exemplary three-stage, diode-loaded TIA.

An exemplary three-stage, diode-loaded TIA 100 is shown in FIG. 1. The TIA 100 comprises a chain of first, second and third transistor amplifiers 101, 103,105, extending between a signal input ($V_{IN}$) and a signal output ($V_O$). As shown, and by way of example, the first amplifier 101 may comprise an n-channel metal-oxide semiconductor (MOS) driving transistor (M1), an n-channel diode-loaded transistor (M4), and a current source 102. The source terminals of the transistors M1 and M4 are tied to ground, and the drain terminals of the transistors M1 and M4 are tied to the current source 102. This structure is repeated for both the second amplifier 103 (comprised of transistors M2 and M5, and current source 104) and the third amplifier 105 (comprised of transistors M3 and M6, and current source 106).

The gate of each driving transistor (M1, M2, M3) serves as the signal input to its respective amplifier, and the drain of each driving transistor (M1, M2, M3) serves as the signal output of its respective amplifier. In this context, the input of the second amplifier 103 is connected to the output of the first amplifier 101, and the input of the third amplifier 105 is connected to the output of the second amplifier 103. The output of the third amplifier 105 ($V_O$) and the input of the first amplifier 101 ($V_{IN}$) are tied together by means of the feedback resistor ($R_f$).

Each of the current sources 102, 104, 106 is coupled between the TIA's power supply (VDD) and the drain of a respective one of the driving transistors (M1, M2, M3). The current sources 102, 104, 106 respectively produce the currents I1, I2 and I3.

During operation of the TIA 100, an input current (i) is produced at the TIA's signal input ($V_{IN}$) by, for example, a photosensor 108 (such as a photodiode). This current is then converted to a stable output voltage ($V_O$) via the feedback resistor ($R_f$) in association with the composite inverting amplifier comprised of the chain of amplifiers 101, 103 and 105.

To accommodate the change of output voltage in the third amplifier 105, there is an input-referred voltage change at the input of the third amplifier 105 (i.e., at the gate of transistor M3). The same voltage change occurs at the inputs of the first and second amplifiers 101, 103. Under theoretically ideal conditions, the voltage swing at the signal input $V_{IN}$ (i.e., at the gate of transistor M1) should approach zero if the composite amplifier 101, 103, 105 has a gain tending to infinity. However, under real-world conditions, the gain is small as a result of the finite gain of each of the amplifiers 101, 103 and 105.

Under alternating current (AC) operating conditions, portions of the biasing currents I1, I2 and I3 are diverted to the $g_m$-connected loads (M4, M5, M6) as AC currents, and thereby produce AC voltages. These AC voltages lead to a difficult design tradeoff, between gain, amplifier time constant and power. For high-speed circuit designs that feature small amplifier time constants, the gains of the amplifiers 101, 103, 105 are often reduced, and the power of the TIA 100 is increased (i.e., by increasing the biasing currents I1, I2 and I3). Although this makes the composite amplifier formed by the amplifiers 101, 103 and 105 faster, it leads to higher power consumption and poor suppression of capacitive parasitic effects associated with the input ($V_{IN}$) and output ($V_O$) of the TIA 100 (i.e., because of the finite gain contributed by the chain of amplifiers 101, 103, 105). Thus, the TIA 100 is not power-bandwidth efficient and suffers from poor design tradeoffs. In addition, the TIA 100 can suffer from poor performance as a result of process variations that cause the currents I1, I2 and I3 to vary.

Figure 2:
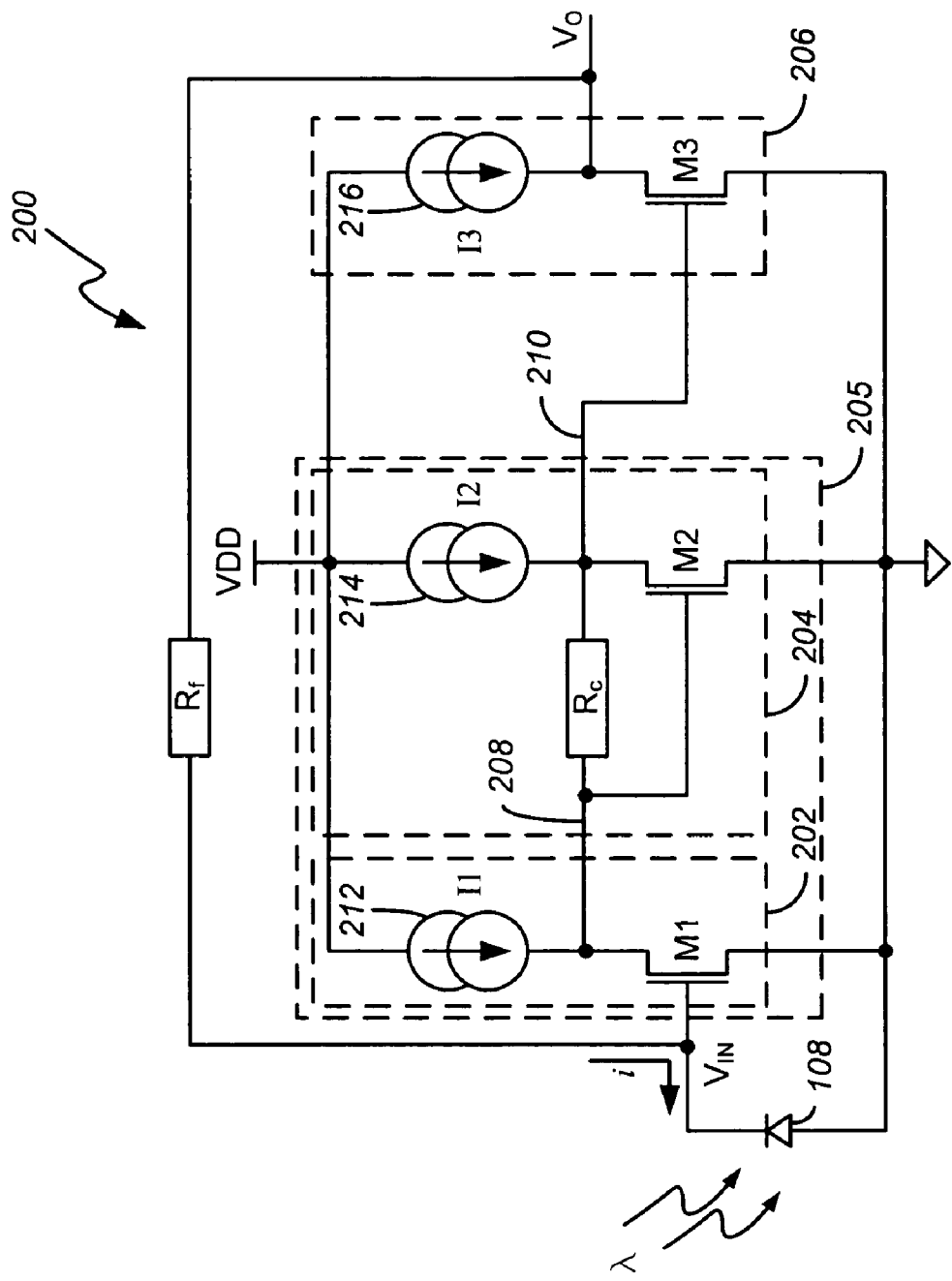
FIG. 2 illustrates an exemplary process-independent TIA.

FIG. 2 illustrates an exemplary process-independent TIA 200 that can be used as an alternative to the diode-loaded TIA 100. The TIA 200 comprises an input amplification stage 205, an output amplification stage 206, and a feedback resistor ($R_f$). The feedback resistor ($R_f$) is coupled between the output ($V_O$) of the output amplification stage 206 and the input ($V_{IN}$) of the input amplification stage. The input amplification stage 205 of the TIA 200 is non-inverting, and the output amplification stage 206 is inverting.

The input amplification stage 205 comprises a transconductance stage 202 and a TIA 204. The output 208 of the transconductance stage 202 is coupled to the input of the TIA 204, and the output 210 of the TIA 204 is coupled to the input of the output amplification stage 206.

The TIA 204 comprises a feedback resistor ($R_c$) that is coupled between the TIA's input 208 and output 210. Of note, the TIA 204, which includes the feedback resistor $R_c$, is nested within the TIA 200, which includes the feedback resistor $R_f$.

By way of example, the input transconductance stage 202, TIA 204 and output amplification stage 206 may each comprise a MOS transistor (M1, M2, M3). The gate of each MOS transistor (M1, M2, M3) serves as the respective stage's input, and the drain of each MOS transistor (M1, M2, M3) serves as the respective stage's output (208, 210, $V_O$). Each of the MOS transistors (M1, M2, M3) is connected via its source and drain between one of a plurality of current sources 212, 214, 216 and ground.

Each stage 202, 204, 206 of the TIA 200 is biased (or "armed") by a current (I1, I2 or I3) of a respective current source 212, 214, 216. That is, the transconductance stage 202 is biased by a first current source 212; the TIA 204 is biased by a second current source 214; and the output amplification stage 206 is biased by a third current source 216.

During operation of the TIA 200, an input current (i) is produced at the TIA's signal input ($V_{IN}$) by, for example, a photosensor 108 (such as a photodiode). This current is then converted to a stable output voltage ($V_O$) via the feedback resistor ($R_f$) in association with the composite inverting amplifier comprised of the chain of amplifier stages 202, 204 and 206.

Figure 3:
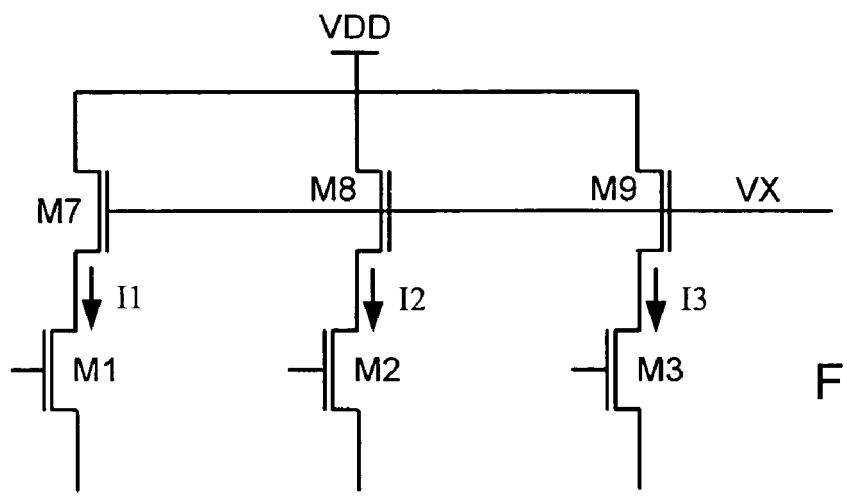
FIG. 3 illustrates how the currents I1, I2 and I3 shown in FIG. 2 may be formed by a plurality of current source transistors, each of which is controlled by a gate voltage VX.

As shown in FIG. 3, each of the current sources 212, 214, 216 may comprise a MOS transistor (M7, M8, M9) that is coupled between the power supply (VDD) and a drain of one of the transistors M1, M2 or M3. The gates of the current source transistors (M7, M8, M9) may be driven by a voltage on a node VX of a master current source circuit 400 (shown in FIG. 4). By appropriately sizing the ratio of the current source transistors (M7, M8, M9) with reference to the current mirror transistor M14 of the master current source circuit 400, the current source transistors (M7, M8, M9) produce an appropriate ratio of currents I1, I2 and I3.

The reference current (I) of the master current source circuit 400, which is related to the voltage on the node VX, may be produced in a variety of ways. Of importance, however, is that the master current source circuit 400 is provided with a reference resistor (R) that influences the value of the reference current (I), and thus the values of the currents I1, I2 and I3. In this manner, the currents I1, I2 and I3 can be caused to vary with manufacturing variances of the reference resistor R. Also, and by forming the resistors R, $R_f$ and $R_c$ using a common manufacturing process, the performance variations in the first and second nested TIAs 200, 204 can be tracked to variations in the currents I1, I2 and I3. Performance variations in the nested TIAs 200, 204, current sources 212, 214, 216 and master current source circuit 400 can also be tracked to one another by forming the transistors of each using a common manufacturing process. In this manner, the performance of the TIA 200 is substantially process-independent. And, by eliminating the $g_m$-connected loads (M4, M5, M6) of the TIA 100, the TIA 200 draws less current and uses less power. This can be explained by the negative shunt feedback of the nested TIA 204, which reduces the impedance associated with its input and output and thus 1) provides the non-inverting input amplification stage 205 with smaller amplifier time constant, while 2) permitting higher gain for the TIA 200, and 3) not significantly jeopardizing the stability of the TIA 200. Hence, the TIA 204 allows for higher gain in the input amplification stage 205 while also reducing the TIA's current biasing requirements. Due to the high-gain and high-bandwidth of the composite TIA 200, the parasitic capacitances associated with its input and output are better suppressed. As a result, the TIA 200 provides a higher gain-bandwidth product and better power-bandwidth tradeoff than the diode-loaded TIA 100.

Figure 4:
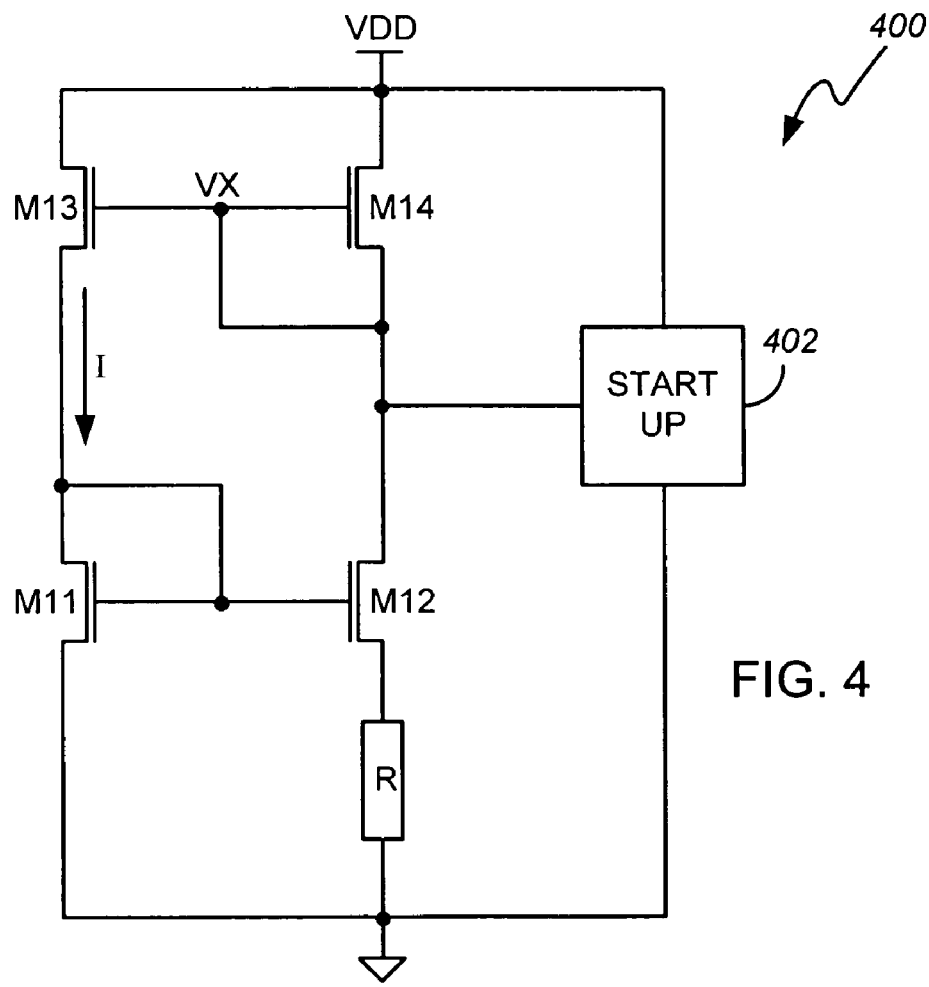
FIG. 4 illustrates a master current source that generates the voltage VX for controlling the current source transistors shown in FIG. 3.

One exemplary implementation of the master current source circuit 400 is shown in FIG. 4. As shown in FIG. 4, the master current source circuit 400 may comprise a startup circuit 402 and a balanced current mirror (composed of transistors M11, M12, M13 and M14). The startup circuit 402 may take various forms, but in one form comprises the startup circuit disclosed in U.S. Pat. No. 4,458,212 of Brehmer et al.

Although the current sources 212, 214, 216 that produce the currents I1, I2 and I3, and the current source circuit 400 that produces the current I, have been discussed as if they are distinct current sources, the boundaries between these current sources are somewhat amorphous. Therefore, and in the claims, the combination of all of these current sources may be generally referred to as "a current source circuit".

The amplifier 200 can be especially useful in light sensing systems comprising a photosensor (such as a photodiode 108). This is because the amplifier 200 can amplify relatively small photocurrents (i) in a process-invariant manner, and do so more quickly (i.e., at high bandwidth), and using less power, than the amplifier 100.

What is claimed is:

1. An amplifier circuit, comprising:
   a current source circuit having a reference resistor, the current source circuit producing first, second and third bias currents that vary with manufacturing variances of the reference resistor;
   an input amplification stage comprising i) a transconductance stage biased by the first bias current, and ii) a first transimpedance amplifier (TIA) biased by the second bias current, the first TIA having a first feedback resistor coupled between its input and its output, and the input of the first TIA being coupled to an output of the transconductance stage;
   an output amplification stage biased by the third bias current, the output amplification stage having an input coupled to an output of the first TIA; and
   a second feedback resistor, coupled between the output of the output amplification stage and the input of the transconductance stage to form a second TIA; wherein the reference resistor, the first feedback resistor and the second feedback resistor are formed using a common manufacturing process.

2. The amplifier circuit of claim 1, wherein the transconductance stage, the first TIA and the output amplification stage each comprise a single metal-oxide semiconductor (MOS) transistor, with a gate of the transistor serving as the stage's input, and with a drain of the transistor serving as the stage's output.

3. The amplifier circuit of claim 2, wherein the current source circuit comprises a plurality of MOS transistors; and wherein the MOS transistors of the current source circuit, the transconductance stage, the first TIA and the output amplification stage are all formed using a common manufacturing process.

4. A light sensing system, comprising:

a photosensor;

a current source circuit having a reference resistor, the current source circuit producing first, second and third bias currents that vary with manufacturing variances of the reference resistor;

an input amplification stage comprising i) a transconductance stage biased by the first bias current, the transconductance stage having an input coupled to an output of the photosensor, and ii) a first transimpedance amplifier (TIA) biased by the second bias current, the first TIA having a first feedback resistor coupled between its input and its output, and the input of the first TIA being coupled to an output of the transconductance stage;

an output amplification stage biased by the third bias current, the output amplification stage having an input coupled to an output of the first TIA; and a second feedback resistor, coupled between the output of the output amplification stage and the input of the transconductance stage to form a second TIA; wherein the reference resistor, the first feedback resistor and the second feedback resistor are formed using a common manufacturing process.

5. The light sensing system of claim 4, wherein the photosensor is a photodiode.

6. The light sensing system of claim 4, wherein the transconductance stage, the first TIA and the output amplification stage each comprise a single metal-oxide semiconductor (MOS) transistor, with a gate of the transistor serving as the stage's input, and with a drain of the transistor serving as the stage's output.

7. The light sensing system of claim 6, wherein the current source circuit comprises a plurality of MOS transistors; and wherein the MOS transistors of the current source circuit, the transconductance stage, the first TIA and the output amplification stage are all formed using a common manufacturing process.

* * * * *